(12) United States Patent
Hougham

(10) Patent No.: US 6,764,313 B2
(45) Date of Patent: Jul. 20, 2004

(54) HIGH DENSITY INTERCONNECTS

(75) Inventor: Gareth Hougham, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/038,483

(22) Filed: Jan. 3, 2002

(65) Prior Publication Data

US 2004/0048497 A1 Mar. 11, 2004

(51) Int. Cl.[7] .............................................. H01R 12/00
(52) U.S. Cl. .......................... 439/65; 439/60; 439/66; 439/80; 439/81; 439/84; 439/59
(58) Field of Search ............................ 439/59, 60, 66, 439/80, 81, 84, 65

(56) References Cited

U.S. PATENT DOCUMENTS

| | | | |
|---|---|---|---|
| 4,620,761 A | * 11/1986 | Smith et al. | 439/372 |
| 6,224,392 B1 | * 5/2001 | Fasano et al. | 439/66 |
| 6,287,126 B1 | * 9/2001 | Berger et al. | 439/66 |
| 6,439,894 B1 | * 8/2002 | Li | 439/66 |

FOREIGN PATENT DOCUMENTS

JP          03023379 A  *  1/1999  ............. F03G/7/06

OTHER PUBLICATIONS

Abstract in English for JP 03023379A*

* cited by examiner

Primary Examiner—Dean A. Reichard
Assistant Examiner—Jinhee Lee
(74) Attorney, Agent, or Firm—Perman & Green, LLP; Daniel P. Morris, Esq.

(57) ABSTRACT

A method of forming an electrical interconnection between a first electrical device and a second electrical device comprises the steps of providing contacts in an uncompressed state. The uncompressed contacts are then deformed to a compressed state and then the contacts are positioned in a device adapted to hold the contacts between the first and second electrical devices. Or alternatively, the uncompressed contacts are positioned in the device and then compressed to the compressed state. The contacts are then activated to substantially expand to the uncompressed state wherein each contact expands to substantially its uncompressed state for establishing the electrical interconnection between the first and second electrical devices.

8 Claims, 6 Drawing Sheets

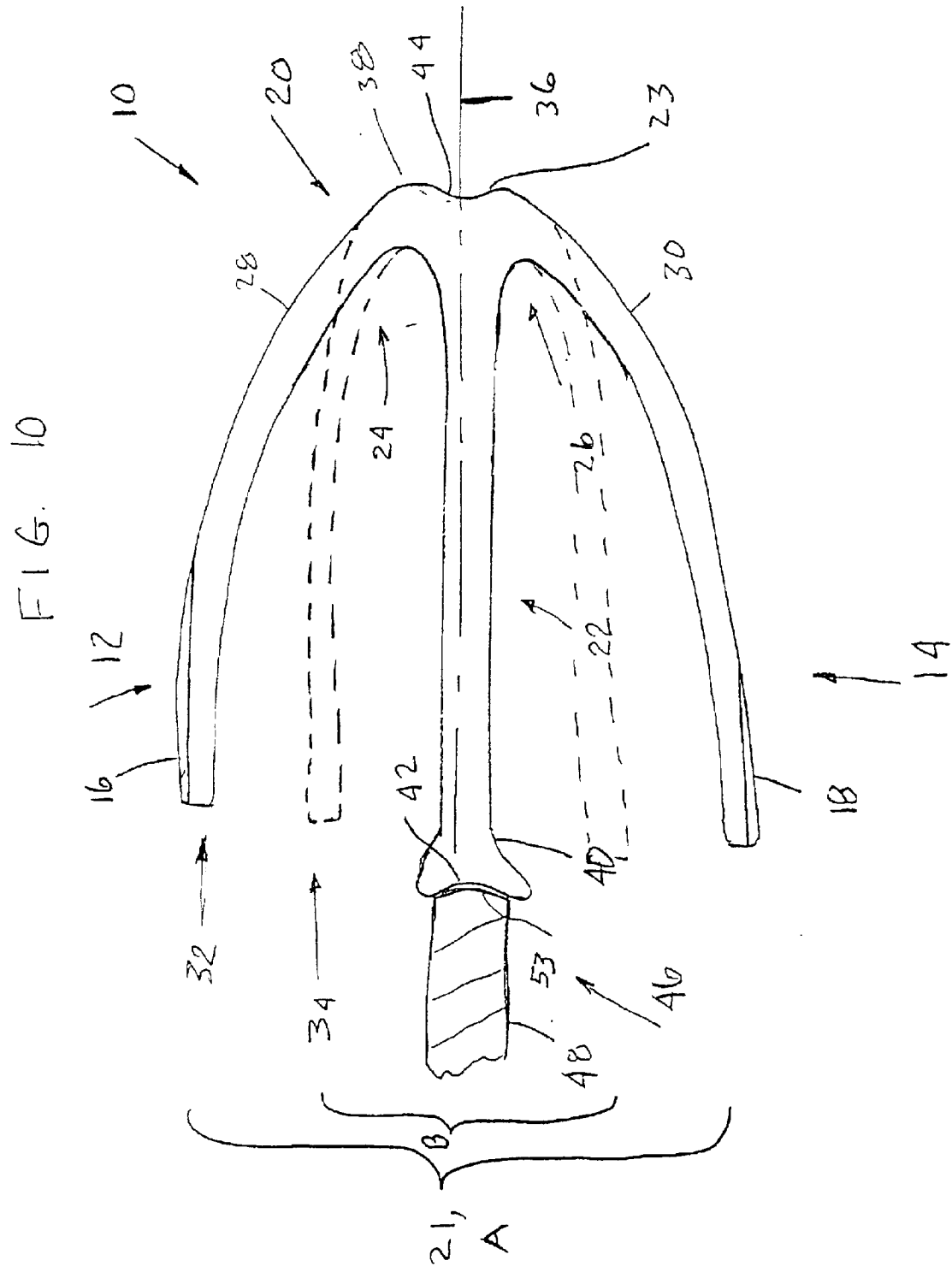

HIGH DENSITY INTERCONNECTS

BACKGROUND OF THE INVENTION

1. Field of the Invention

The present invention relates to electrical interconnections and the electrical contacts for making these interconnections, and, more particularly, to establishing electrical contacts between chip modules or multi-chip modules (MCM) and printed circuit boards (PCBs).

2. Brief Description of Related Developments

The interconnection between a high density multi-chip module (MCM), for example, and a printed circuit board (PCB) typically uses a Ball Grid Array (BGA) or a Land Grid Array (LGA) or a combination of both. These two dimensional arrays provide a plurality of electrical paths between an integrated circuit (IC) package or chip module, a chip carrier, or directly to a chip and a printed circuit board normally positioned in the IC package and under the array. Each electrical path is provided by an electrical contact that is held within an interposer or connector by a variety of techniques. It may be further desired that the connection be non-permanent so that the chip module may be removed for the purpose of upgrading and/or repair such as changing a CPU or adding more memory. In prior LGAs (land grid arrays) connecting ceramic chip modules to boards, a 2D array of springs made from random coils of wire was used. However, the large force required to properly load and actuate the interposer often breaks the expensive chip module.

Another problem with prior art interposers is the loss of restoring force over time rendering the electrical connection vulnerable to failure. This is known to happen with filled elastomer type interconnects and also with metal interconnects due to mechanical wearout mechanisms.

Thus, there exists a need for a LGA connector or interposer that eliminates the stress placed on the IC device upon inserting the IC device into a housing for holding the IC package, and one that does not share the severe loss of restoring force over time exemplified by the filled elastomer type.

SUMMARY OF THE INVENTION

In one aspect, the present invention is directed to a method of forming an electrical interconnection between a first electrical device and a second electrical device. In one embodiment, the method comprises providing contacts in an uncompressed state. The uncompressed contacts are then deformed to a compressed state and then the contacts are positioned in a device adapted to hold the contacts between the first and second electrical devices. Alternatively, the uncompressed contacts are positioned in the device and then compressed to the compressed state. The contacts are then activated to substantially expand to the uncompressed state wherein each contact expands to substantially its uncompressed state for establishing the electrical interconnection between the first and second electrical devices.

In another aspect the present invention is directed to a method of forming an electrical connection between a first electrical device and a second electrical device. In one embodiment the method comprises providing contacts composed of a shape memory material. The contacts are deformed to a second position, a compressed state, and then assembled in the compressed state into a device for positioning the contacts between the electrical devices. After the device for positioning is positioned with the contacts in the compressed state between the first and second electrical devices, the contacts are activated to a substantially uncompressed state to make the electrical connection between the first and second electrical devices.

In a further aspect, the present invention is directed to a contact for establishing an electrical connection between a first electronic device and a second electronic device. In one embodiment, the contact comprises a flexible conductive body formed in a first position and adapted to be set into a second position. The contact is activated into a third position in order to accommodate a variable gap between the first electronic device and the second electronic device for establishing the electrical connection.

BRIEF DESCRIPTION OF THE DRAWINGS

The foregoing aspects and other features of the present invention are explained in the following description, taken in connection with the accompanying drawings, wherein:

FIG. 10 is one embodiment of the present invention showing a side view detailing the electrical contact of FIG. 1A.

DETAILED DESCRIPTION OF THE PREFERRED EMBODIMENT

Figure 1A:
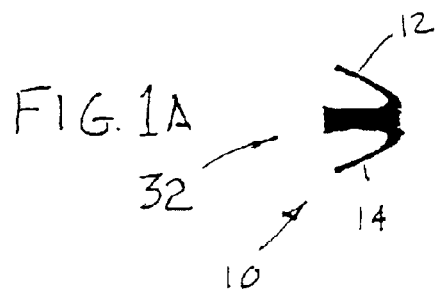
FIG. 1A is one embodiment of electrical contact having an E shape incorporating features of the present invention in a pre-set, uncompressed shape.

Referring to FIG. 1, several embodiments of electrical contacts incorporating features of the present invention are shown. Although the present invention will be described with reference to the embodiments shown in the drawings, it should be understood that the present invention can be embodied in many alternate forms of embodiments. In addition, any suitable size, shape or type of elements or materials could be used.

The electrical contacts of the present invention generally comprise spring-like contacts that can be preset prior to assembly and released in-situ to establish the electrical connection between electronic circuit devices. It is a feature of the present invention for the electrical contacts to make the electrical connection in a manner that self-adjusts to variations in the width of any gap encountered. Shape memory materials can be used for the electrical contacts, and further superelastic materials also provide further advantages.

Figure 1B:
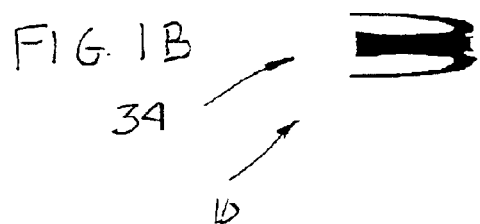
FIG. 1B is the electrical contact of FIG. 1A in a compressed state.
Figure 1C:
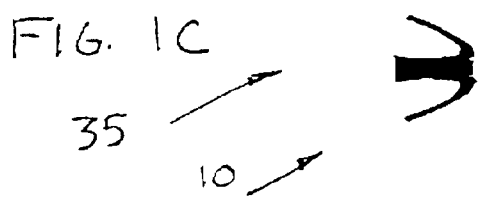
FIG. 1C is the electrical contact of FIG. 1B in the a restored shape of FIG. 1A after activation by a raised temperature.

An electrical contact 10 of FIGS. 1A to 1C are generally made of a shape memory material, activated by heat to return to an original shape, which places contacting sections of the contacts 10 against pads of the adjacent circuit devices. The electrical contacts may be either installed in an interposer pre-set to a first position, a maximum length, or installed compressed in a second position, a minimum length, and held in that position until heat activated to expand to the third position. Different configurations of the electrical contacts are disclosed and others are clearly within the scope of the invention.

One of the several embodiments of the electrical contact 10 is shown in FIG. 1A having an E shape and further detailed in FIG. 10 wherein the contact 10 may be manufactured from sheet material or molded from alloys such as Nitinol, a NiTi alloy made by Oremet-Wah Chang having shape memory properties. The NiTi alloy is further a superelastic material, which enhances its ability to repeatedly flex between several positions without plastic deformation, but the contacts of the present invention are not required to have both shape memory material and superelastic material although in one embodiment this is specified. The contact 10 is stamped or formed from a sheet material or other materials to form the contact 10 having spring arms 12, 14, with contacting sections 16, 18, having a coating made of gold or silver, for example. The contact 10 has a main body 20 having a substantially planar design or molded with a rounded 3D shape. The spring arms 12, 14 have lower arms 28, 30 which are connected to a central section 22 at an end 38 with bights 24, 26, respectively. The thickness of the bights 24, 26 must be sufficient to allow the spring arms 12, 14 to flex from a final memory form, a pre-set condition, or a first position 32, as shown in FIG. 10, to a deformed or compressed shape, a second position 34, as shown by outline in FIG. 10. The angle formed between the spring arm 12, bight 24, and the central section 22 is generally acute in the present embodiment. The central section 22 can have a central axis 36 about which the spring arms 12, 14 are mirrored although this is not required. Further, the central section 22 may have on the opposing ends 38, 40 indents 42, 44, for example, which may be used in affixing the contact 10 onto an interposer 46 with an end 48, only partially shown by a carrier layer 88, FIG. 11. Other means may be used to hold the contacts in the interposer such as a bonding material, a frictional fit, or even an overlying layer.

As shown in FIGS. 1 to 4, several embodiments of electrical contacts 10, 54, 56 and 58 may be installed in LGA (land grid array) interposers or connectors for use in IC packages. Although specific embodiments of the contacts are shown, other contacts having different shapes are feasible. Further, the contacts may be used in other electrical devices to establish electrical contacts between the various devices. The interposer provides a plurality of electrical paths between, for example, chip modules and a PCB. Although a specific embodiment of the present invention discloses the use of a shape memory material for use in the contacts, other materials are useable and further other means for holding the contacts in the compressed state are disclosed.

Figure 11:
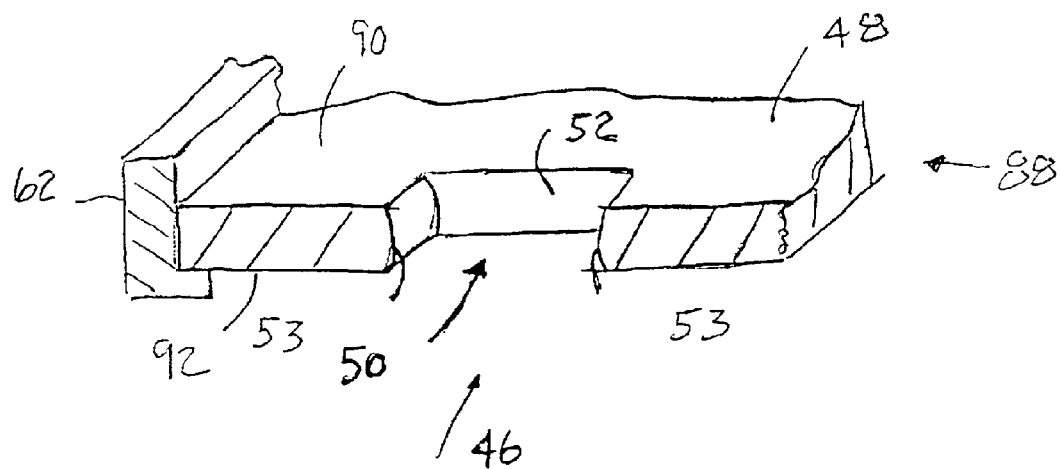
FIG. 11 is a partial cross-section in perspective view of an interposer for holding the electrical contacts of one embodiment of the present invention.

Referring to FIG. 11, the interposer 46 is partially shown. The interposer 46 has the carrier layer 88 made from an insulative material such as plastic or a dielectric material or other suitable material but in one embodiment the electrical c may be be held in the interposer by means of insulative material and then the interposer itself need not be insulative in this embodiment. The carrier layer 88 in general has a flat upper surface 90 and a flat lower surface 92. The is carrier layer 88 is further fixedly mounted in an interposer frame 62 that holds the layer 88, FIG. 6A. The carrier layer 88 has a plurality of contact passageways 50, only one shown, for receiving the electrical contacts 10. The passageways 50 are located in the interposer 46 so that the electrical contacts 10 when restored to a third position 35, FIG. 1C, make physical contact with the pads on the first and second circuit members. The passageways 50 may be of a physical configuration to retain the electrical contacts 10 therein or the contacts 10 may be retained therein by other methods.

As seen in FIG. 11, the passageway 50 may be a rectangular opening in the carrier layer 88 having two side walls 52, only one shown, and two end walls 53 having a convex shape towards each other. The convex shape allows each end wall 53 to fit closely into the indents 42, 44 of the contact 10 to hold the contact 10 within the carrier layer 88 of the interposer 46. Other suitable means are clearly feasible for holding the contact in the interposer or connector such as, for example, where the side walls at one end of the passageway are closer together to hold the contact by a friction fit therein. The contacts may also be held in the passageway 50 by means of a plastic insulative material as already noted.

Figure 6A:
FIG. 6A shows one embodiment of the method of the present invention by block diagram of the MCM, the interposer, the PCB and housing before assembly.
Figure 6B:
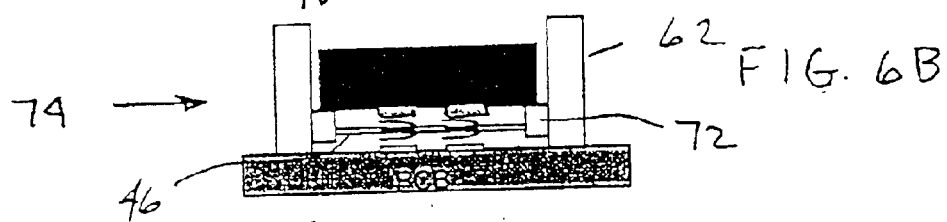
FIG. 6B is a block diagram of the assembled IC component of FIG. 6A where the interposer has the electrical contacts of FIG. 1B in the compressed condition.
Figure 6C:
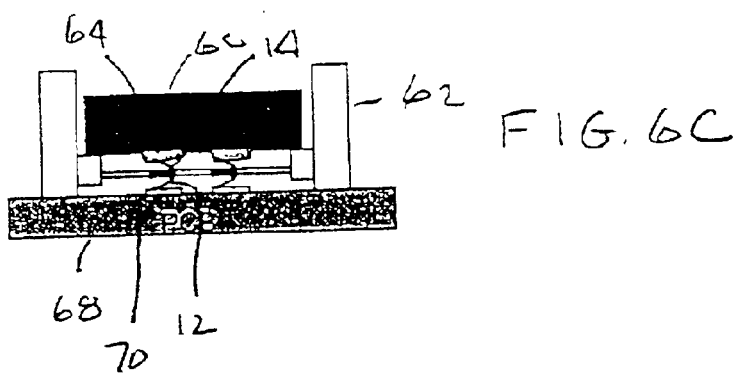
FIG. 6C is the assembled IC component of FIG. 6B where the interposer has the electrical contacts of FIG. 1C in the restored condition where electrical contact has been established.

Referring to FIG. 1A, the electrical contact 10 may be stamped from a sheet of material to have the shape shown in the pre-set position, the first position 32, which is the final memory form. Contact 10, for example, is heat treated to a temperature above 500 degrees Celsius for duration from about 5 to 15 minutes to cause the structural changes in the material which sets the shape as the memorized shape form. In this desired memorized shape, the contacting sections 16, 18 of FIG. 10 will eventually make electrical contact as shown in FIG. 6C, for example. After annealing at 500 degrees Celsius, the contact is cooled to room temperature. In order to obtain the contact 10 in the compressed state, the second position 34, the contact is then plastically deformed to the second position to correspond to FIG. 1B where the arms 12, 14 and the contacting sections 16, 18 are pushed toward the central section 22. These arms 12, 14 having been plastically deformed maintain this compressed state during further processing as long as the temperatures remain below about 60 to 65 degrees Celsius, for example. Thus, these contacts 10 can be fitted into the interposer 46 to form a large two-dimensional array as shown in FIG. 5B. The interposer 46 with the compressed contacts 10 therein would be assembled into position between a chip module and a circuit board as shown in FIGS. 6A and 6B. The contacts are then activated to return to their memorized expanded shape so as to make continuous contact between the chip module and the circuit board. This is accomplished by heating the assembly to above 65 degrees Celsius, preferably 70 to 120 degrees Celsius, at which temperatures, the contact 10 will return to the originally memorized shape. In the process, the arms 12, 14 will expand until contacting the contact pads on the chip module and the PCB. The arms 12, 14 will exert a restoring force against the pads indefinitely, as long as the dimension of the gap is smaller than the memorized shape dimension between the contacting sections of the arms 12, 14, for example. This same process will provide interconnections by using contacts having different shapes than the ones disclosed.

Referring to FIG. 10, the main body 20 of the contact 10 has the first contacting section 16 and the second contacting section 18 integrally formed thereon and is merely designated as such to indicate where the pads of the electrical devices contact the spring arms. The contacting sections 16, 18 are on opposing ends or sides of the main body 20. The main body 20 has a flexible section 21 that translates or rotates in the direction between the contacting sections. The flexible section 21 has a variable length from a maximum length A to a minimum length B so that the variable length between the contacting sections 16, 18 automatically adjusts to a gap distance between appropriate pads between the first and second circuit members when the circuit members are installed in the IC package.

Figure 5A:
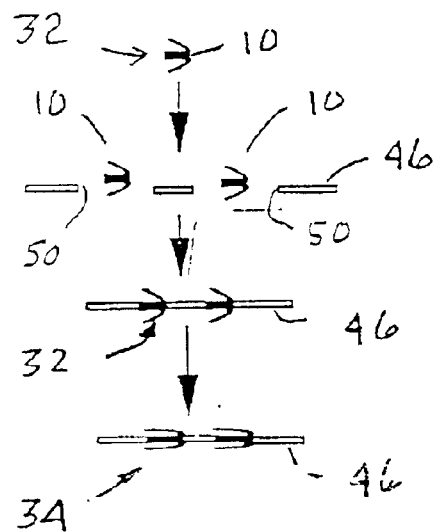
FIG. 5A shows one embodiment of a method for the placement of the uncompressed contacts incorporating features of the present invention of FIG. 1A into an interposer and establishing the compressed state of the contacts while in the interposer during assembly.
Figure 5B:
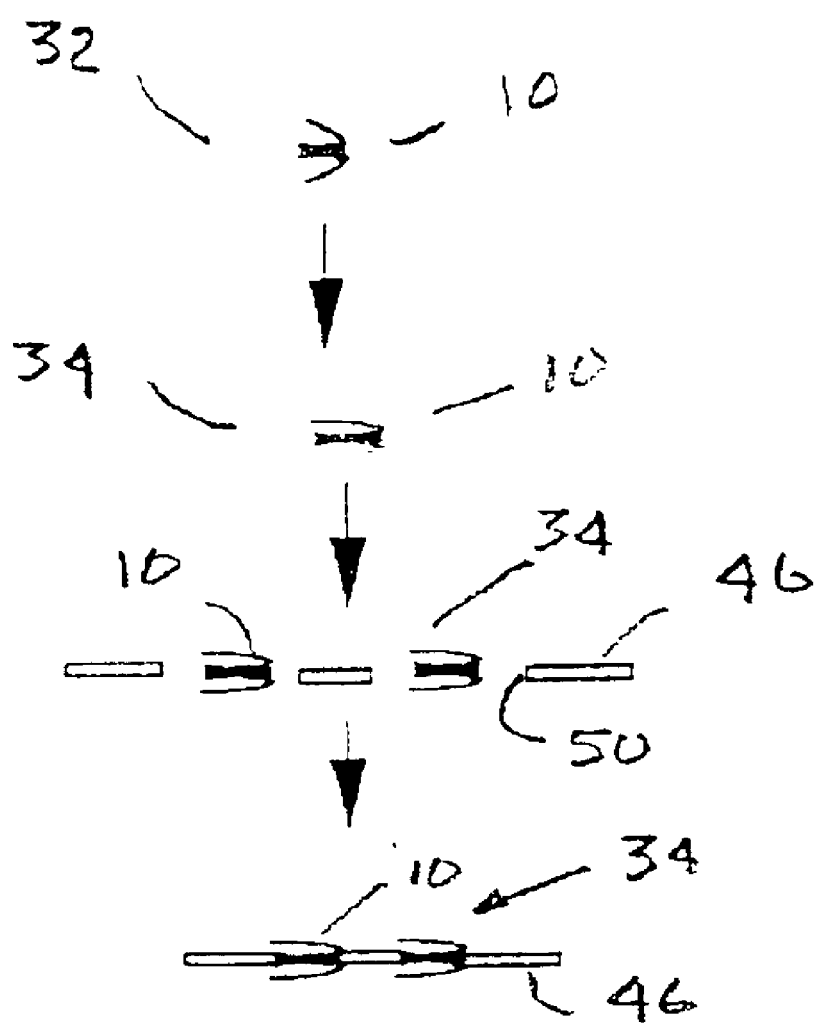
FIG. 5B shows in sequence the compression of an uncompressed contact, followed by placement of the compressed contacts of FIG. 1B into an interposer.

The process of placing the contacts 10 into a plurality of passageways 50 of the interposer 46 is shown in FIGS. 5A and 5B. FIG. 5A illustrates the process of installing the contacts 10 into the interposer 46 in the uncompressed condition and thereafter the contacts 10 are compressed as a group. FIG. 5B illustrates the process of installing the contacts into the interposer 46 in the compressed condition.

In the first step of FIG. 5A, each individual contact 10 being in the pre-set condition, first position 32, is inserted into the interposer 46 in appropriate passageways 50. After the contacts 10 are installed in the interposer 46, such as, for example, by friction fit, by a glue material, an appropriate device, not shown, such as a flat plate held in a press, will compress the spring arms 12, 14, into a deformed condition, second position 34, at an appropriate temperature T2 to cause the deformed spring arms to remain in that position. The interposer 46 with the contacts installed is then inserted into an electrical device such as an IC package, FIGS. 6A to 6C.

In FIG. 5B, an alternative embodiment of installing the contacts into the interposer carrier layer is illustrated. Each contact 10 may be compressed before installation and then installed in the interposer carrier layer 88.

In either embodiment as shown by FIG. 5A or FIG. 5B, after the interposer 46 is installed in the IC package, appropriate heat treatment will cause the spring arms 12, 14 to return to the expanded position, the third position 35.

Other shapes of contacts are clearly within the scope of the invention as seen in FIGS. 2 to 4 and these are merely illustrative of the different shapes of contacts that operably function in the present invention.

Figure 2A:
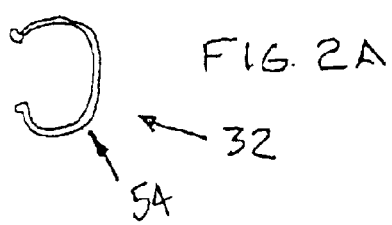
FIG. 2A is one embodiment of electrical contact having a C shape incorporating features of the present invention in a pre-set shape.
Figure 2B:
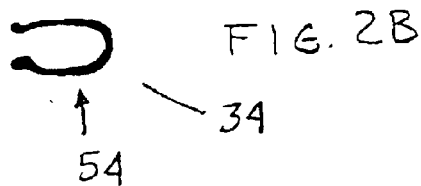
FIG. 2B is the electrical contact of FIG. 2A in a compressed state.
Figure 2C:
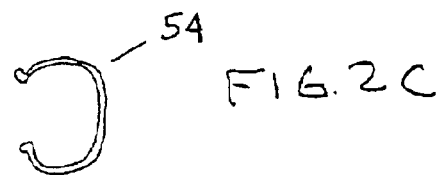
FIG. 2C is the electrical contact of FIG. 2B in the restored shape of FIG. 2A after activation by a raised temperature.

In greater detail as to the other shapes, FIGS. 2A to 2C disclose a C shaped contact 54 in various conditions: FIG. 2A illustrates this condition as being a pre-set condition or an uncompressed state or the first position 32; FIG. 2B illustrates a deformed condition, or compressed state, or the second position 34, and FIG. 2C is a restored condition, or third position 35, similar to the pre-set condition shown in FIG. 2A.

Figure 3A:
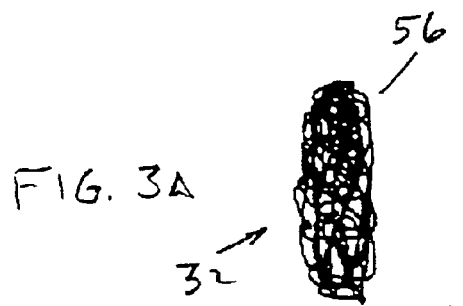
FIG. 3A is one embodiment of electrical contact having a shape of a random coil spring incorporating features of the present invention in a pre-set shape.
Figure 4A:
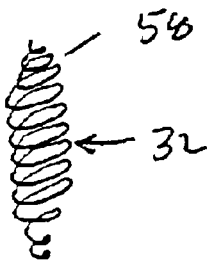
FIG. 4A is one embodiment of electrical contact having a shape of a helical spring incorporating features of the present invention in a pre-set shape.
Figure 3B:
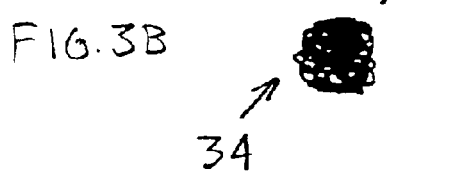
FIG. 3B is the electrical contact of FIG. 3A in a compressed state.
Figure 4B:
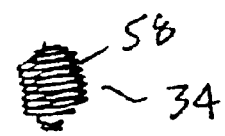
FIG. 4B is the electrical contact of FIG. 4A in a compressed state.
Figure 3C:
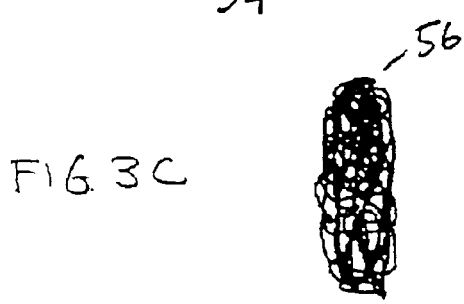
FIG. 3C is the electrical contact of FIG. 3B in the restored shape of FIG. 3A after activation by a raised temperature.
Figure 4C:
FIG. 4C is the electrical contact of FIG. 4B in the restored shape of FIG. 4A after activation by a raised temperature.

FIGS. 3A to 3C disclose a random coil spring 56 in similar positions and FIGS. 4A to 4C disclose a helical spring 58 also in similar positions. The random coil spring 56 may also be described as a spaghetti spring and this type of spring is exemplified by the Cinch® spring type made of molybdenum with a gold coating, for example.

Figure 12:
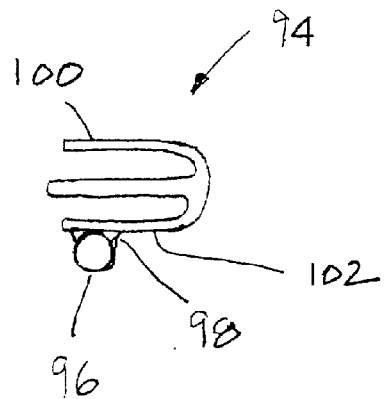
FIG. 12 is one embodiment of the present invention showing by a side view the electrical contact of FIG. 1A having a solder ball locate-d on the lower spring arm.

In a still further embodiment of the electrical contact, FIG. 12 illustrates a combination LGA/BGA contact 94 wherein an upper spring arm 100 is similar to the upper spring arm 12 of the contact 10. A lower spring arm 102 has a solder ball 96 attached thereon by an adhesive material 98. The solder ball 96 may be connected to the printed circuit board in a conventional manner as used in the BGA process and thus the upper electrical device, not shown, may be removed while the interposer remains physically connected to the lower electrical device, not shown, such as a PCB.

FIGS. 6A to 6C illustrate in sequential figures the installation of the interposer 46 pre-attached to the interposer frame 62 having the contacts 10 in the deformed condition, the second position 34 of an IC package 74. As seen in FIG. 6A, a first circuit device or member such as a multi-chip module (MCM) 60, for example, is positioned over the interposer frame 62. The MCM 60 has a plurality or flat electrical pads 64 located on a bottom surface 66 that are connected to electronic circuit devices or members mounted in the MCM 60. The interposer frame 62 has conventional means therein for aligning the MCM 60, the interposer 46, and a second circuit member such as the printed circuit board (PCB) 68 so that when the contacts 10 are activated to the resorted condition, the contacting sections 16, 18 of the spring arms 12, 14 will physically contact appropriate electrical pads 64 on the MCM 60 and pads 70 on the PCB 68. FIG. 6B illustrates the MCM 60 resting in the frame 62 by a down stop 72. As seen therein, the interposer 46 has the contacts 10 in the deformed condition, the second position 34, so that no contacting sections of the contacts 10 touch any of the pads. As seen in FIG. 6C, the spring arms 12, 14, after appropriate heat treatment, have returned to the restored condition, the third position 35, and are in electrical contact with the pads 64, 70 of the MCM 60 and PCB 68, respectively. The IC package 74, FIG. 6B, could be heated to 30 degrees or greater (preferably >10 to 25 degrees above the transition) at which time the metal parts would undergo shape memory elastic recovery to its pre-set open C shape. Thus, establishing in-situ, a reliable contact force, which would automatically accommodate a gap in the z-direction or other non-uniformities in the top and bottom mating components. In a preferred example, a Nitinol alloy consisting of nickel and titanium, would have a transition temperature around 60 degrees centigrade. Thus raising the assembly temperature to 70 degrees centigrade or higher would result in restoration of the C set to the pre-set memorized form.

Figure 7:
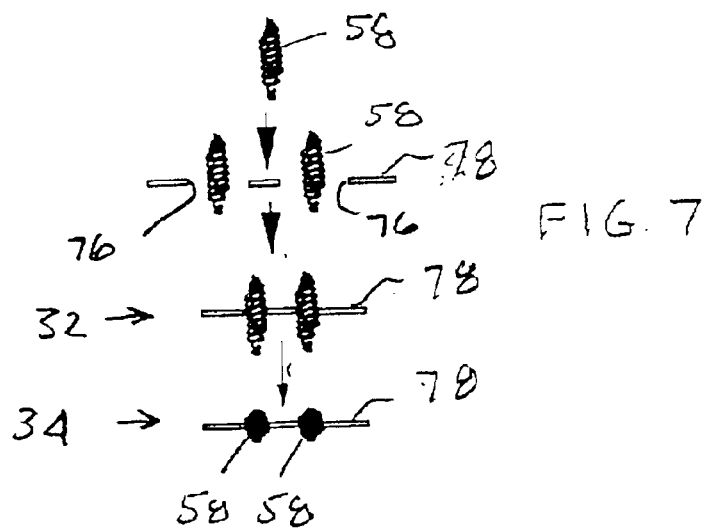
FIG. 7 is one embodiment of a method of the present invention showing in sequence the placement of the contacts of FIG. 4A into an interposer and the establishment of the compressed state of the contacts in the interposer during assembly.

FIG. 7 is, in sequence, the process of installing helical springs 58 into an interposer carrier layer 78. Each individual helical spring 58 is positioned and installed in the plurality of passageways 76. After this, a compression device operating at a predetermined low temperature (i.e., room temperature) deforms the springs 58 into the shape shown in FIG. 4B.

Figure 8A:
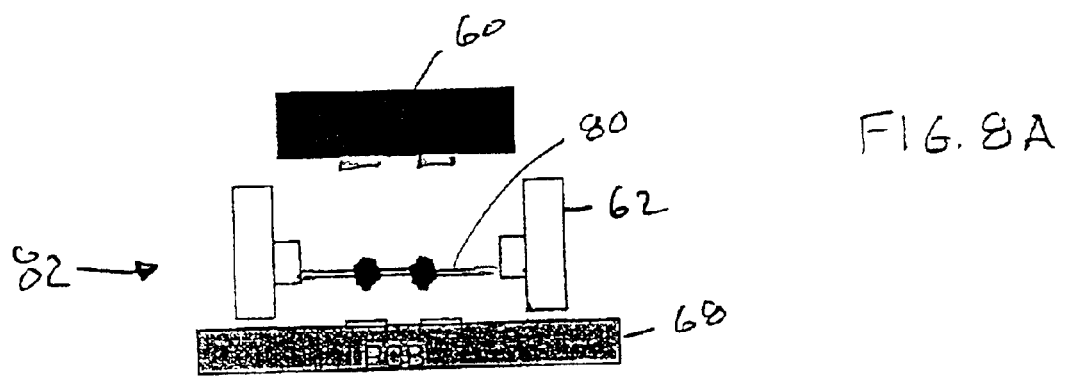
FIG. 8A is a block diagram of the MCM, the interposer having the electrical contacts of FIG. 4A, the PCB and housing before assembly.
Figure 8B:
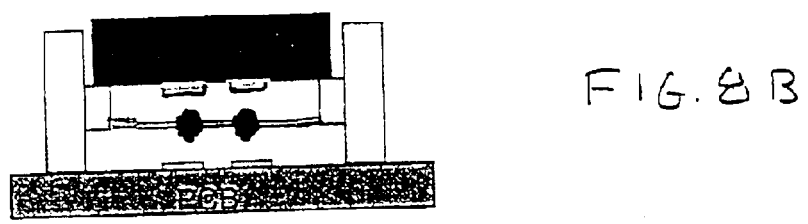
FIG. 8B is a block diagram of the assembled IC component of FIG. 8A where the interposer has the electrical contacts of FIG. 4B in the compressed condition.
Figure 8C:
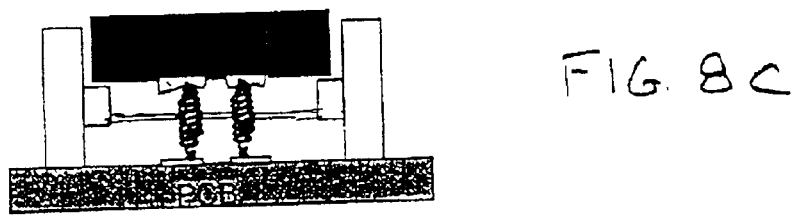
FIG. 8C is the assembled IC component of FIG. 8B where the interposer has the electrical contacts of FIG. 4C in the restored condition.

FIGS. 8A to 8C similarly illustrate as FIGS. 6A to 6C, a sequence of installing the interposer 80 into an IC package 82. Upon heat activation, the helical springs 58 expand to the pre-set shape and come into contact with the pads of both the first and the second circuit members.

In another embodiment of the contact, a simple spring acting as the contact is covered with a droplet of a meltable material such as wax or a conductive meltable material such as solder. In this embodiment spring is made of a standard non-shape memory material. The spring is compressed while the material is hot and liquid and then allowed to cool and harden in the compressed state. After the compressed contacts are installed in the interposer or the contacts are compressed after installation in the interposer, the compressed contacts are then thermally activated to remelt the material and allow the spring to be released to make electrical contact with the pads.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

What is claimed is:

1. A contact for establishing an electrical connection between a first electronic device and a second electronic device, the contact comprising:

a flexible conductive body comprising a shape memory material formed in a first position and the flexible conductive body set into a second, compressed position between the first electronic device and the second electronic device and upon heat activation, the flexible conductive body in a third, expanded position in order to accommodate a variable gap between the first electronic device and the second electronic device for establishing the electrical connection.

2. A contact in accordance with claim 1 wherein the contact, in the second compressed position, upon heat activation of the shape memory material, translates to the third expanded position.

3. A contact in accordance with claim 2 for use in an interposer wherein the shape memory material is a nickel titanium alloy.

4. A contact in accordance with claim 2 wherein the shape memory material has a martinsitic transition temperature in the range between –20 to 100 degrees C.

5. A contact in accordance with claim 2 further comprising the shape memory material being superelastic.

6. A contact in accordance with claim 1 wherein the electrical contact is selected from the contacts having a shape of an E, a C, a Random coil spring, and a helical spring.

7. A contact for forming an electrical connector between a first electronic device and at least a second electronic device comprising:

a conductive body comprising a shape memory material formed in a first, uncompressed state, the conductive body in a second compressed state in order to position the conductive body between the first device and the second device, wherein the conductive body in the second state is not contacting either the first device or the second device; the conductive body in a third state when heat activated to expand from the second compressed state to the third state to accommodate a gap between the first device and second device and establish the electrical connection.

8. The contact of claim 7 wherein the conductive body is heat activated and expands into the third state from the second state when the body is exposed to a predetermined amount of heat.

* * * * *